(12) United States Patent
Hsueh

(10) Patent No.: US 6,775,139 B2
(45) Date of Patent: Aug. 10, 2004

(54) STRUCTURE FOR REMOVABLE COOLER

(75) Inventor: Paul Hsueh, Concord, CA (US)

(73) Assignee: Ma Laboratories, Inc., San Jose, CA (US)

( * ) Notice: Subject to any disclaimer, the term of this patent is extended or adjusted under 35 U.S.C. 154(b) by 0 days.

(21) Appl. No.: 10/337,782

(22) Filed: Jan. 8, 2003

(65) Prior Publication Data

US 2004/0130873 A1 Jul. 8, 2004

(51) Int. Cl.[7] .............................................. H05K 7/20
(52) U.S. Cl. ...................... 361/697; 361/695; 361/704; 361/700; 165/80.3; 165/104.33; 257/719
(58) Field of Search ................................. 361/692, 695, 361/687, 697, 700–710; 165/80.1, 80.2, 80.3, 165, 185, 104.31, 104.32, 104.33, 121, 127; 257/707–727; 454/184; 439/247

(56) References Cited

U.S. PATENT DOCUMENTS

| | | | | |
|---|---|---|---|---|
| 5,335,722 A | * | 8/1994 | Wu | ............................ 165/122 |
| 5,835,347 A | * | 11/1998 | Chu | ............................ 361/697 |
| 5,973,921 A | * | 10/1999 | Lin | ............................ 361/695 |
| 6,269,001 B1 | * | 7/2001 | Matteson et al. | ........... 361/695 |
| 6,435,889 B1 | * | 8/2002 | Vinson et al. | .............. 439/247 |

OTHER PUBLICATIONS

USPGPUB 2002/0088607 A1, Jul. 11, 2002, Lo.*

* cited by examiner

Primary Examiner—Michael Datskovsky
(74) Attorney, Agent, or Firm—Troxell Law Office PLLC (57) ABSTRACT

A removable cooler on the memory module wherein the PC board is able to attach on the memory module without any modification. The cooler contains a heat sink module and a cooler module. The heat sink module is combined by two heat conductive heat sinks placed oppositely and screwed or tenoned on the memory module to stimulate heat exchange above the extension part of the heat sinks. The cooler module could be a fan or heat conductive tube. As a fan, it could be buckled on the memory module socket for the extension part of the heat sinks to stimulate heat exchange. As a heat conduction tube screwed or tenoned against the extension part of the heat sinks, it stimulates heat exchange and provides heat dispensation function to assure the performance of the memory module.

9 Claims, 8 Drawing Sheets

STRUCTURE FOR REMOVABLE COOLER

FIELD OF THE INVENTION

The present invention relates to a cooler, especially a removable cooler on the memory of a PC.

BACKGROUND OF THE INVENTION

Traditionally, during the run time of a PC, the electronic components inside and memory module generate lots of heat, especially the new memory module required by high-level computers. The temperature of the memory module going up continuously affects operation performance, even causes the memory module to break down. Currently, a cooler designed for such a heat dispensation problem of the memory module is still unavailable.

In view of such the unavailability, the inventor of the present invention was devoted to finding a solution and accomplished structural improvement for cooler.

SUMMARY OF THE INVENTION

The main objective for the present invention is to provide a removable cooler on the memory module inside a PC, wherein the PC board is able to attach on the memory module without any modification. The cooler contains a heat sink module and a cooler module. The heat sink module combined by two pieces of heat conduction heat sinks placed oppositely is screwed or tenoned to the memory module so that the heat generated by the memory module is conducted to the extension part of the heat sink and thus stimulates heat exchange. The cooler module could be a fan or heat conduction tube. If it is a fan, it could be buckled on the memory module socket for the extension part of the two oppositely placed heat sinks to absorb the heat of the memory module and drives heat exchange. If it is a heat conductive tube screwed or tenoned against the extension of the two oppositely placed heat sinks, it absorbs the heat of the memory conducted to the extension part of the two oppositely placed heat sinks and stimulates heat exchange, thus provides heat dispensation to assure the performance of the memory module.

In the following, the embodiment illustrated is used to describe the detailed structural characteristics and operation action for the present invention.

DETAILED DESCRIPTION OF THE INVENTION

Figure 1:
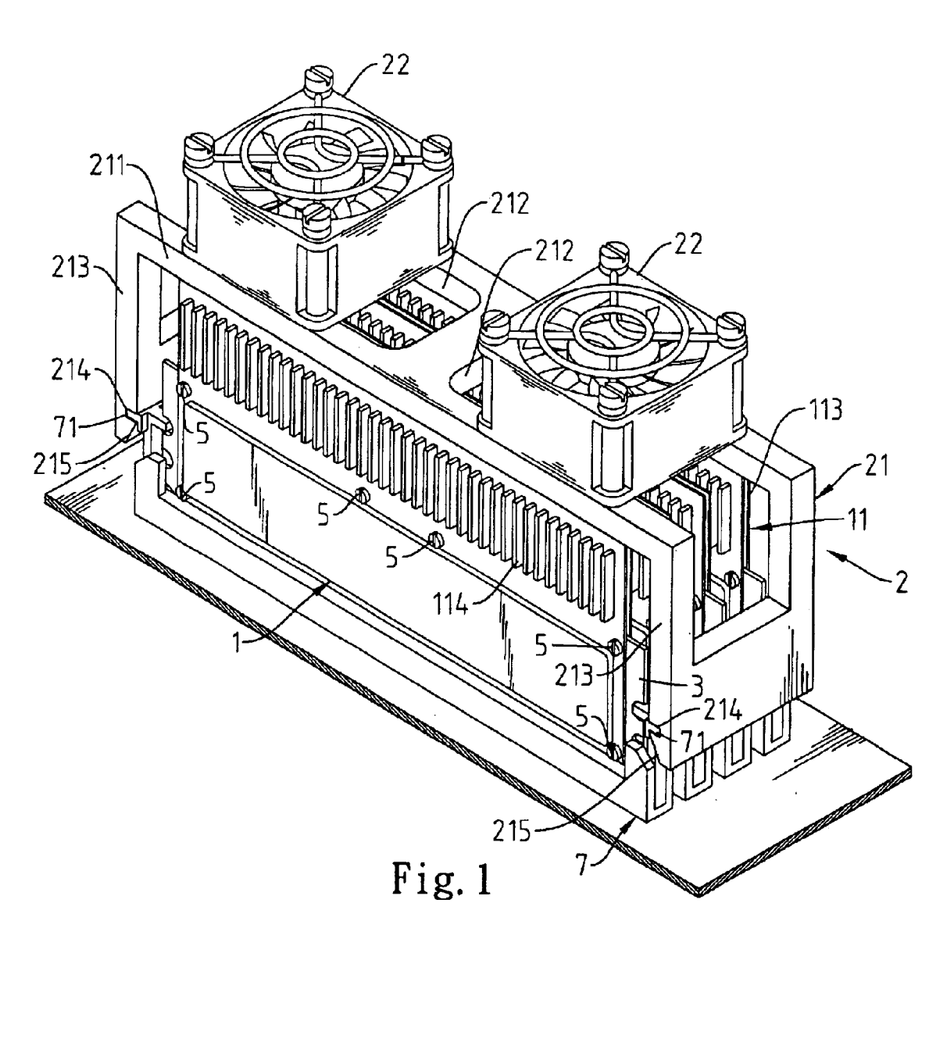
FIG. 1 is a three-dimensional illustration for better application of a removal cooler in the present invention.
Figure 2:
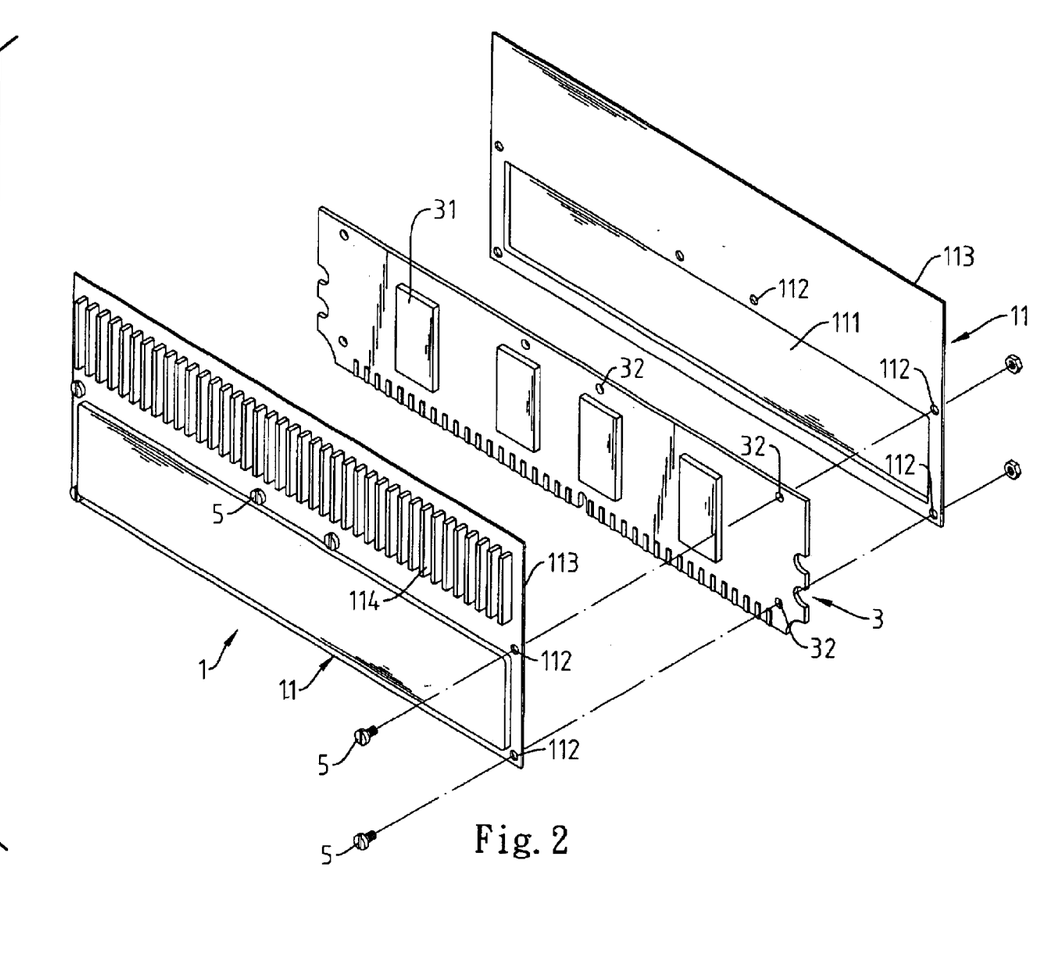
FIG. 2 is a three-dimensional illustration for deformation of a removal cooler's heat sink module in the present invention.
Figure 3:
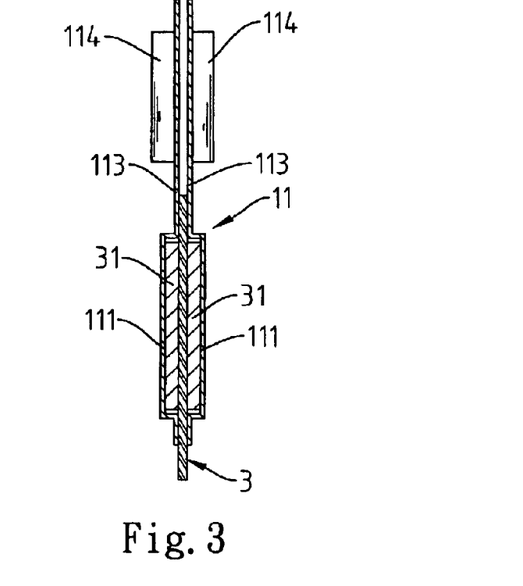
FIG. 3 is a cross-sectional illustration for a heat sink module placed above the memory module in the present invention.
Figure 4:
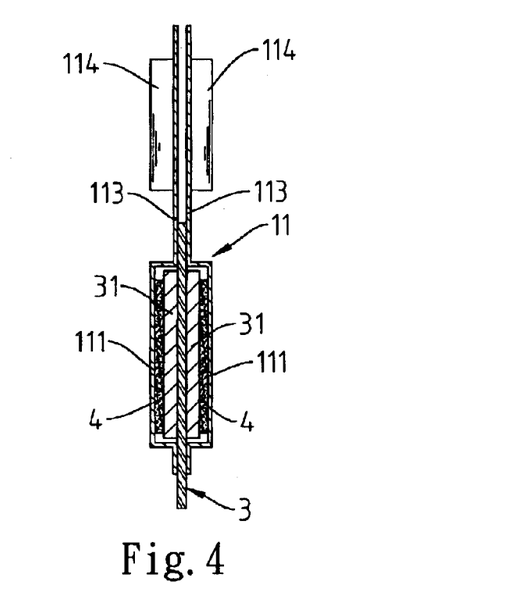
FIG. 4 is a cross-sectional illustration for heat conduction inside heat sink module placed above the memory module in the present invention.
Figure 5:
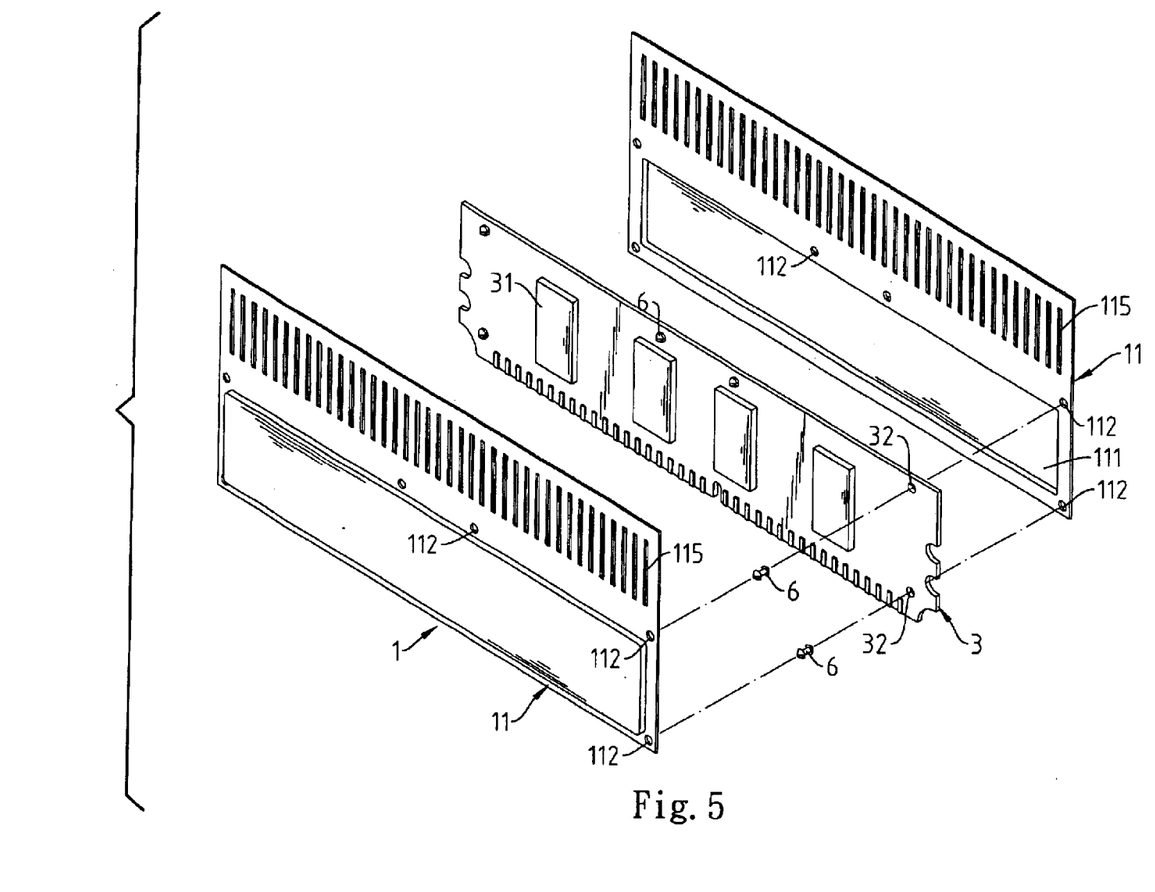
FIG. 5 is an illustration for deformation of another heat sink module covered on the memory module in the present invention.

Please refer to FIG. 1. The present invention provides a removal cooler for the memory module inside a PC, mainly consisting of a heat sink module 1 and a cooler module 2. The heat sink module 1 covered on the memory module 3 contains two pieces of heat-conductive heat sinks 11 placed oppositely. There is a concave 111 on the inner side of each heat sink 11 that shelters and contacts against the chips 31 protruding from both sides of the memory module 3 and conducts heat (as shown in FIG. 3). Otherwise, a heat conduction interface 4 is used between the chip 31 and the concave 111 for heat conduction (as shown in FIG. 4). This heat conduction interface 4 can be heat dispensation ointment or heat dispensation tape. On the two heat sinks 11 placed oppositely there are several holes 112 corresponding to the holes 32 on the memory module 3 so that the two heat sinks 11 can be screwed (as shown in FIG. 2) or tenoned (as shown in FIG. 5) to the memory module 3, on the extension part above the heat sink 11 there are several heat dispensation fins 114 (as shown in FIG. 2) or ventilators 115 (as shown in FIG. 5) for ventilation and heat dispensation.

Figure 6:
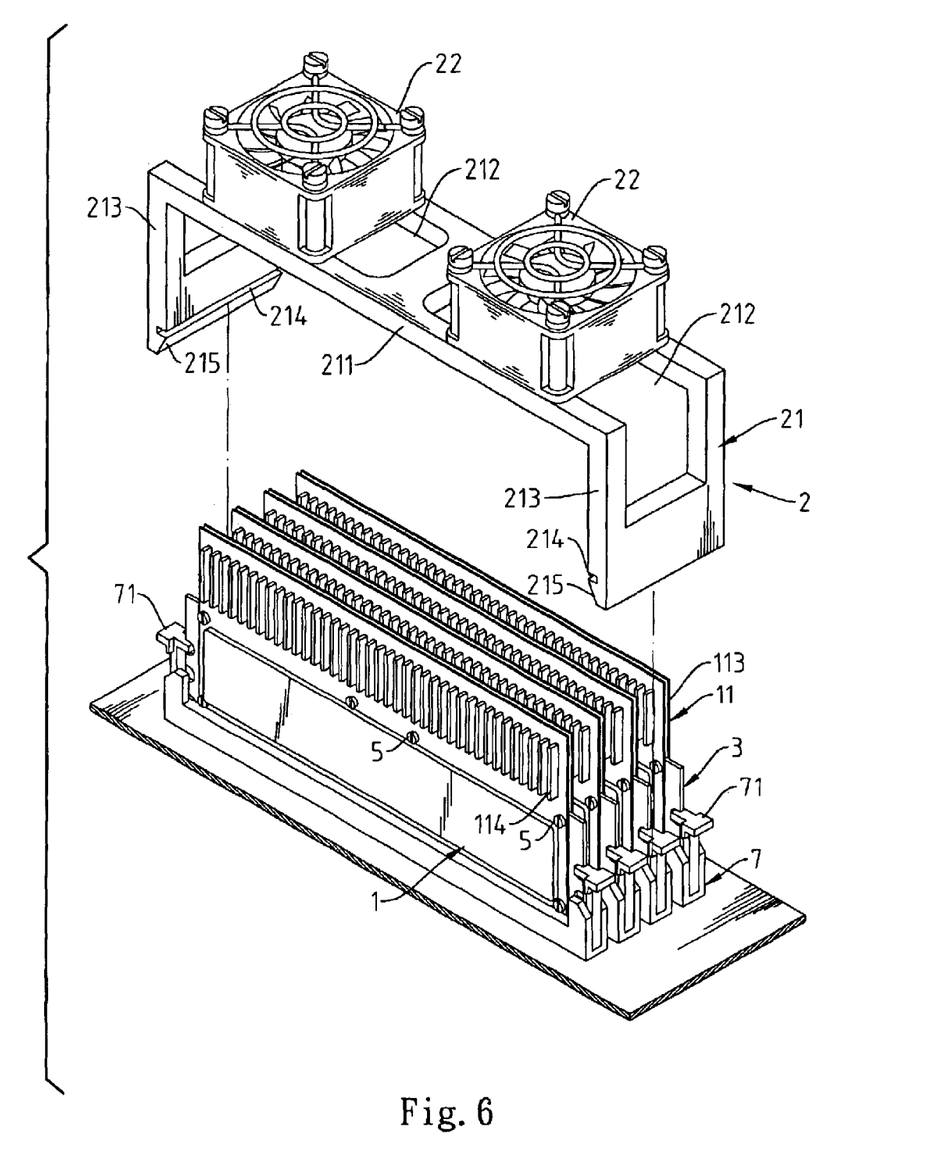
FIG. 6 is a three-dimensional illustration for deformation of the removal cooler in the present invention.

Please refer to FIG. 6. The above cooler module 2 is a fan-style frame that contains a frame 21 and at least one fan 22 (in this case two fans 22 are used). The frame 21 is a π-shaped frame with two flexible sides. On the frame's top 211 there are two holes 212 stretching to the side of the frame. There is a fan 22 placed at different angle on top of the hole, at the bottom of the hole or on one side of the hole (in this case the fan is placed on top of the hole). At the inner bottom of the frame's leg 213 on both sides of the frame 21 there is a cavity 214 and the inner bottom of the two frame's legs 213 are bevels 215.

Figure 7:
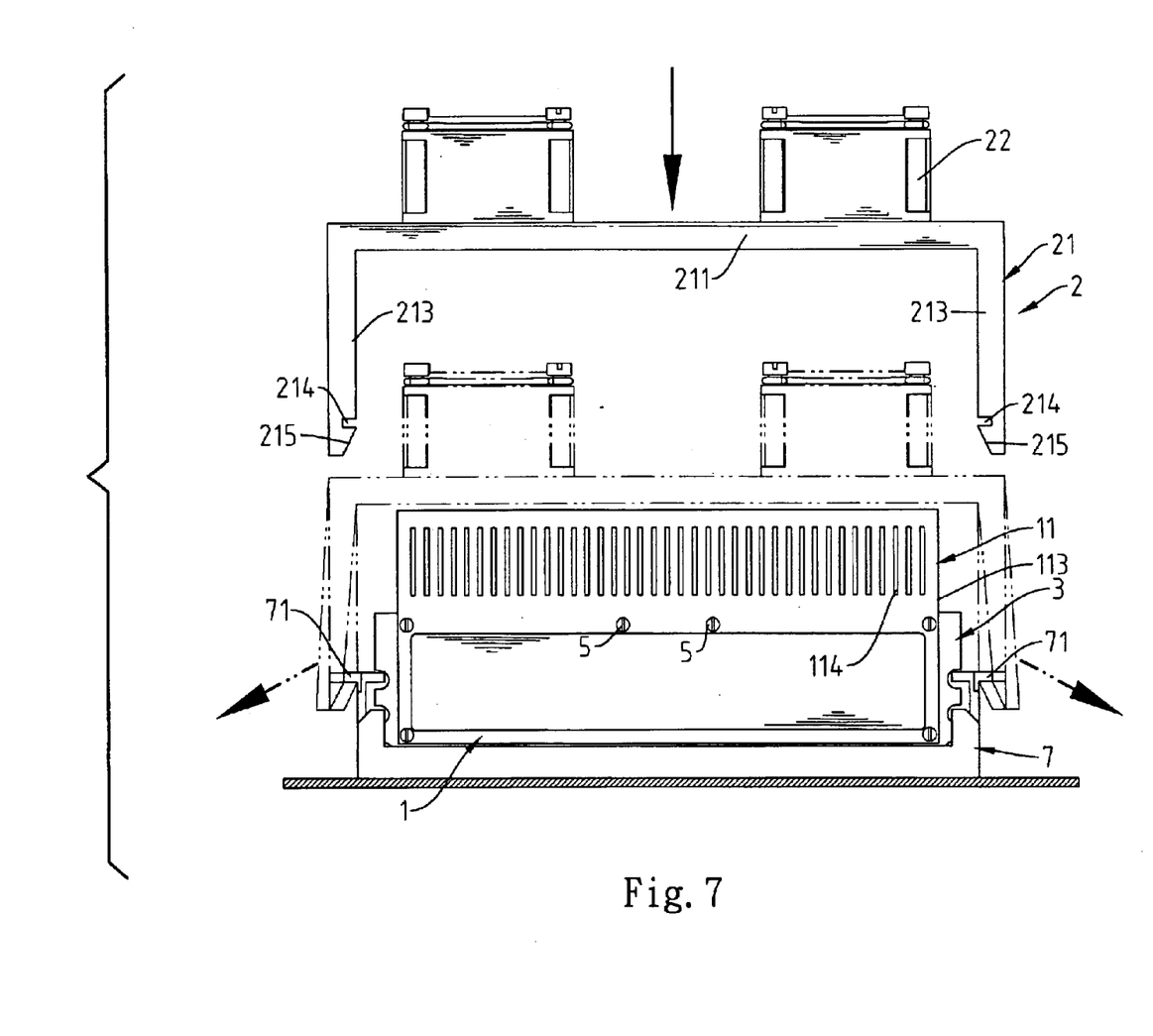
FIG. 7 is an illustration for formation of the frame buckled on the memory socket in the present invention.
Figure 8:
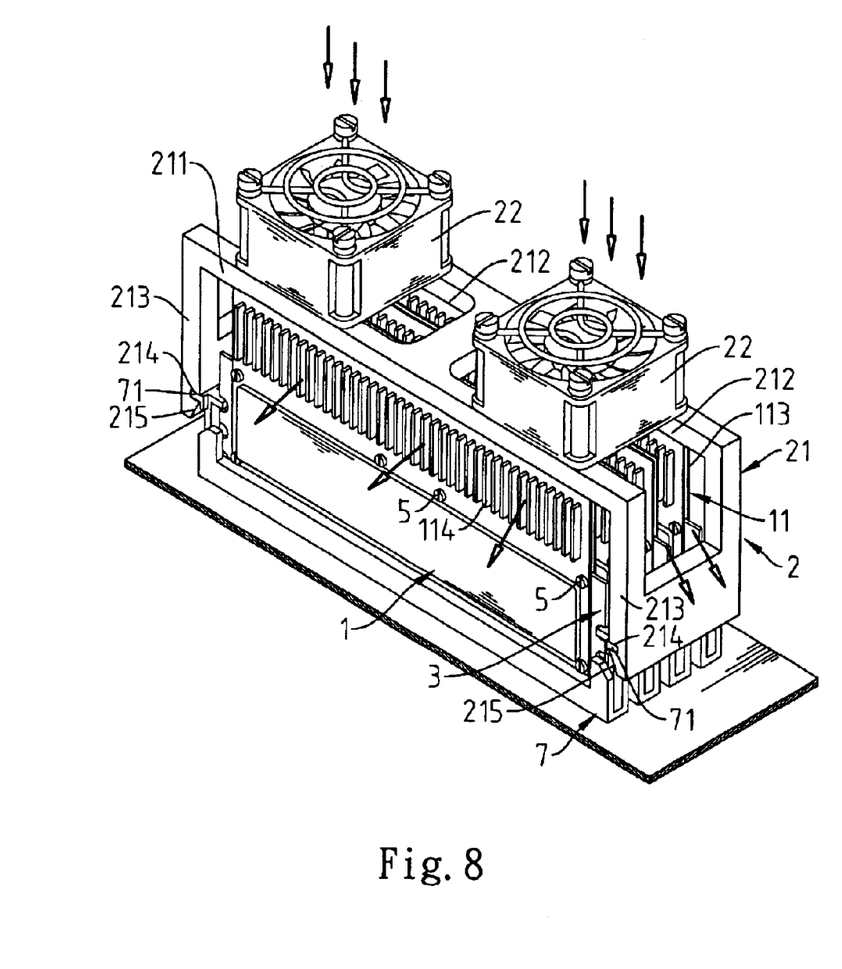
FIG. 8 is an illustration for air convection of the frame bucked on the memory socket in the present invention.

Please refer to FIGS. 6 through 8. Several memory modules 3 are inserted on the memory socket 7 and fixed by hook 71. In this way, when pushing the frame's legs 213 of the frame 21 outward and pushing the bevel 215 at the inner bottom of the two frame's legs 213 toward the hook 71 on both sides of the memory socket 7, the cavity 214 at the inner bottom of the two frames' legs 213 are stuck onto the hook 71 on both sides of the memory socket 7, thus secures the frame 21 above the memory socket 7 with the frame's top 211 and the fan 22 placed above the extension part 113 of the oppositely placed heat sinks 11. In this way, the heat generated by the chip 31 of each pair of memory module 3 is conducted to the extension part 113 through the two heat sinks 11 and the air absorbed by the fan 22 is transmitted to the space above the extension part 113 for ventilation and heat exchange, thus achieves the heat dispensation of the memory module 3 and ensures the performance of the memory module 3.

Figure 9:
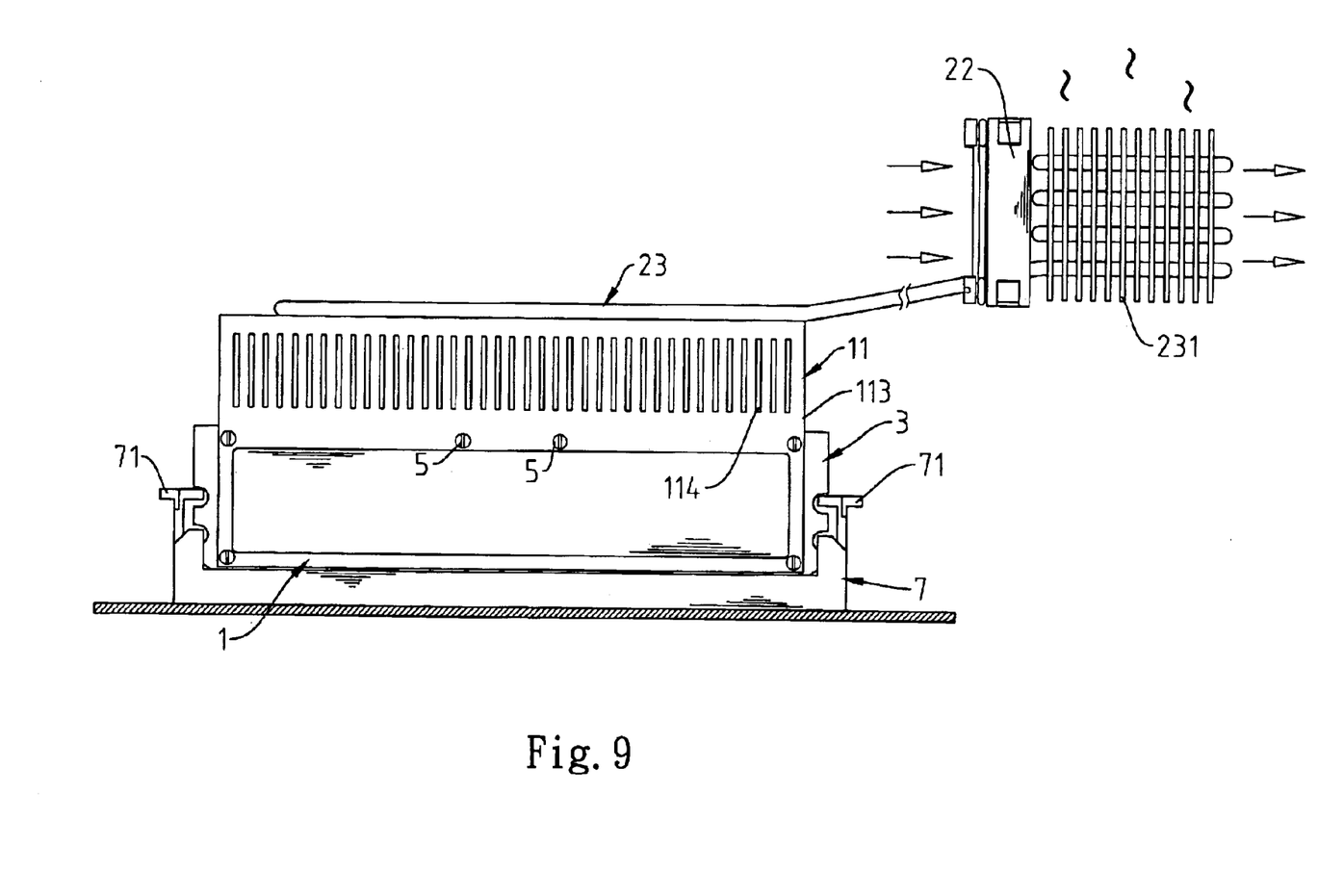
FIG. 9 is a three-dimensional illustration for better application of a removal cooler in the present invention.

Please refer to FIG. 9. The cooler module 2 of the present invention can be a tube combined with a heat-conduction tube 23 and a pair of fans 22. The heat-conduction tube 23 is screwed or tenoned on top of the extension part 113 of the heat sinks 11 and extends outward with heat dispensation fins 231 at the extended end. The fan 22 is placed on one side of the heat dispensation fins 231, allowing the air absorbed by the fan 22 to be transmitted to the space above the heat dispensation fins 231 for heat exchange, thus achieves heat dispensation for the memory module 3 and ensures the performance of the memory module 3.

What is claimed is:

1. A structure for a removable cooler on a memory module inside a PC, comprising:

a heat sink module is combined by two heat conductive heat sinks placed oppositely and screwed or tenoned on said memory module, stimulating heat exchange by transmitting heat generated by said memory module to space above an extension part of said heat sink;

a cooler module consisting of a frame and at least a pair of fans; on both sides of said frame there are flexible frame's legs and two holes on top of said frame stretching to both sides of said frame for ventilation; one of the at least a pair of fans is placed above each of said frame's holes to enhance ventilation;

thus, several memory modules are inserted separately in memory module sockets of a board and said frame's legs pushed outward are stuck with a hook, allowing a frame's top and said at least a pair of fans to be placed above said extension part of said heat sinks for ventilation, stimulating heat exchange to said extension parts, thus to provide heat dispensation for said memory module.

2. The removable cooler for a memory module of claim 1, wherein a cavity and a bevel are set at inner bottom of two frame's legs.

3. The removable cooler on a memory module of claim 1, wherein said bevels on both frame's legs are pushed toward a hook on both sides of said memory module to have said cavity inside said frame's legs stuck on said hook and secure said frame above said memory module socket.

4. The removable cooler on a memory module of claim 1, wherein there is a concave on said heat sink's opposite side that protects and contacts with a chip protruding from said memory module for direct heat conduction.

5. The removable cooler on a memory module of claim 1, wherein a plurality of chips of said memory module and a concave provide heat conduction through a heat conduction interface and said heat conduction interface is one of a heat dispensation ointment and a heat dispensation tape.

6. The removable cooler on a memory module of claim 1, wherein there are holes on said heat sinks corresponding to holes on said memory module so as to be screwed or tenoned and secure two heat sinks on said memory module.

7. The removable cooler on a memory module of claim 1, wherein there are one of heat dispensation fins and ventilators on said extension part of said heat sinks for ventilation and heat dispensation.

8. The removable cooler on a memory module of claim 1, wherein a fan of said frame is placed on a location selected from said frame's top, bottom and two sides for ventilation.

9. The removable cooler on a memory module of claim 1, wherein said cooler module is a heat conduction tube; said heat conduction tube is located against said extension part of said heat sink and has heat dispensation fins at an extended end so as to transmit heat of said extension part of said heat sinks; on one side of said heat dispensation fins there is a fan to stimulate heat exchange above said heat dispensation fins, thus provide heat dispensation for said memory module.

* * * * *